United States Patent [19]

Bozich

[11] 4,122,972

[45] Oct. 31, 1978

[54] WEATHERPROOF CABINET CLOSURE

[75] Inventor: Robert Bozich, Eveleth, Minn.

[73] Assignee: Malton Electric Company, Virginia, Minn.

[21] Appl. No.: 872,106

[22] Filed: Jan. 25, 1978

[51] Int. Cl.$^2$ .................... B65D 73/02; B65D 85/42
[52] U.S. Cl. .................................... 220/331; 220/3.8
[58] Field of Search ............... 220/329, 3.8, 331, 73, 220/74, 242; 49/386; 174/52 R, 61, 48

[56] References Cited

U.S. PATENT DOCUMENTS

| 3,432,967 | 3/1969 | Simon | 49/386 |
| 3,857,198 | 12/1974 | Post | 49/386 |
| 3,945,530 | 3/1976 | Bozich | 220/329 |
| 3,955,709 | 5/1976 | Coley | 220/3.8 X |

Primary Examiner—George T. Hall
Attorney, Agent, or Firm—Merchant, Gould, Smith, Edell, Welter & Schmidt

[57] ABSTRACT

A weather resistant cabinet made up of a cabinet structure and a cover, in which the structure has resilient means extending inwardly and downwardly from the sides thereof, including forwardly directed support means, and the cover has a tongue extending from the bottom of its front portion and stepped inwardly and then downwardly, to facilitate the place of the cover on the structure by a single workman.

4 Claims, 7 Drawing Figures

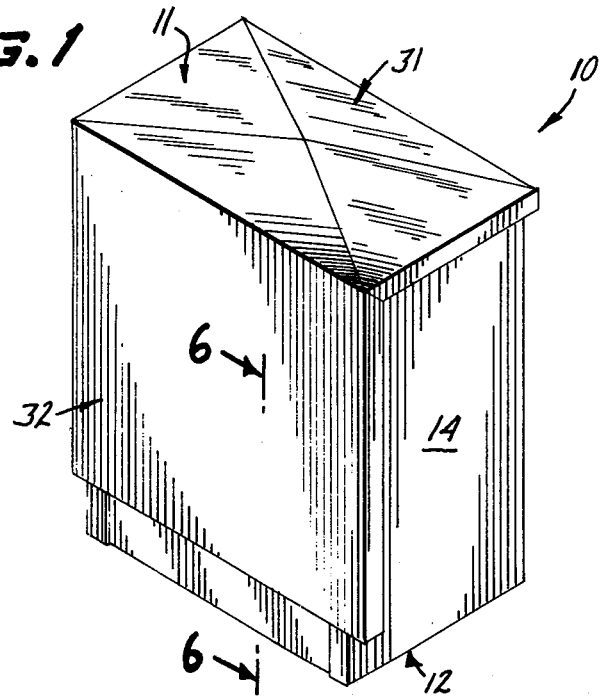
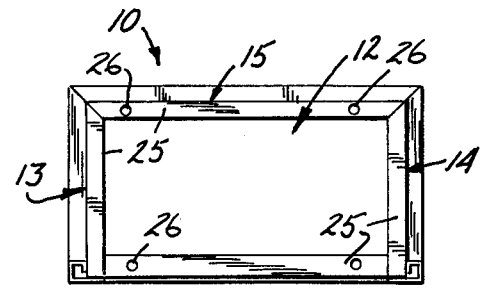
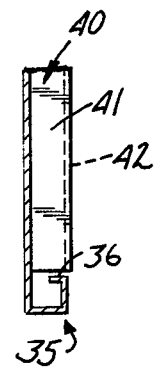
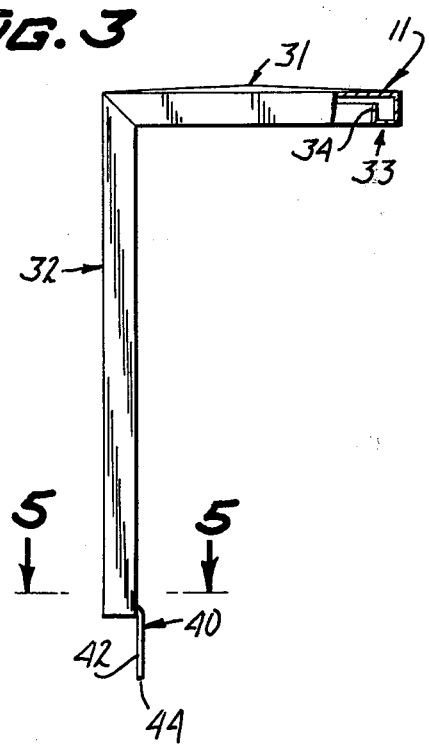
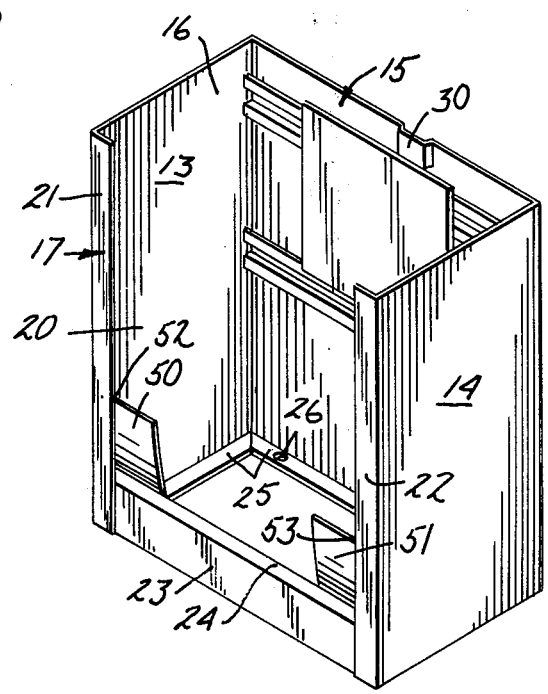

WEATHERPROOF CABINET CLOSURE

BACKGROUND OF THE INVENTION

This invention relates to the field of weather resistant cabinet structures, such as are used in present day electrical distribution systems. Such cabinets must be so constructed as to discourage vandalism and prevent weather damage to the instruments contained therein, as by snow, rain, wind, or blowing dust. It is also desirable, for maintenance purposes, that access to the interior of the cabinets be as complete as possible when they are opened.

One satisfactory cabinet for these uses is shown in my U.S. Pat. No. 3,945,530. Here the top and one face of the cabinet are essentially completely open, but can be closed by a unitary cover which resiliently grips all the open edges to prevent weather infiltration, and which may be locked by a single padlock or other suitable mechanism.

This structure is in general very satisfactory, but in one respect presents difficulty. Particularly when the enclosures are of considerable size, it is simple for one man to open the enclosure, but not so simple for a single man to reposition the bulky and awkward cover in engagement with the five edges which it must engage for proper closure.

SUMMARY OF THE INVENTION

The present invention comprises an improvement on previous cabinets of this type, by simplifying replacement of covers by single workmen. It resides in part in the provision of a specially configured tongue at the bottom edge of the cover, and in part on the provision of closure assist means in the cabinet structure itself, by which the closure process is almost automatically divided into three successive steps, an initial positioning of the cover laterally, an intermediate pivoting of the cover to bring the sides into substantially complete alignment, and a final lowering of the cover to complete the closure. The arrangement includes means supporting the cover during the pivoting movement, so that the workman is relieved of the greater part of its weight, while preventing interference with the closure of the front by any portion of the top, and both the tongue and the closure assist means are fully within the cabinet and protected after the closure is completed.

Various advantages and features of novelty which characterize my invention are pointed out with particularity in the claims annexed hereto and forming a part hereof. However, for a better understanding of the invention, its advantages, and objects attained by its use, reference should be had to the drawing which forms a further part hereof, and to the accompanying descriptive matter, in which there is illustrated and described a preferred embodiment of the invention.

BRIEF DESCRIPTION OF THE DRAWINGS

In the drawing

FIG. 1 is a perspective view of a weather resistant cabinet incorporating my invention.

FIG. 2 is a bottom view of the structure shown in FIG. 1, to a smaller scale.

FIG. 3 is a side elevation of the cover of my cabinet, parts being broken away and shown in section.

FIG. 4 is a perspective view of the cabinet structure with the cover removed.

FIG. 5 is a fragmentary sectional view along the line 5—5 of FIG. 3.

DESCRIPTION OF THE PREFERRED EMBODIMENT

Figures 6, 7:
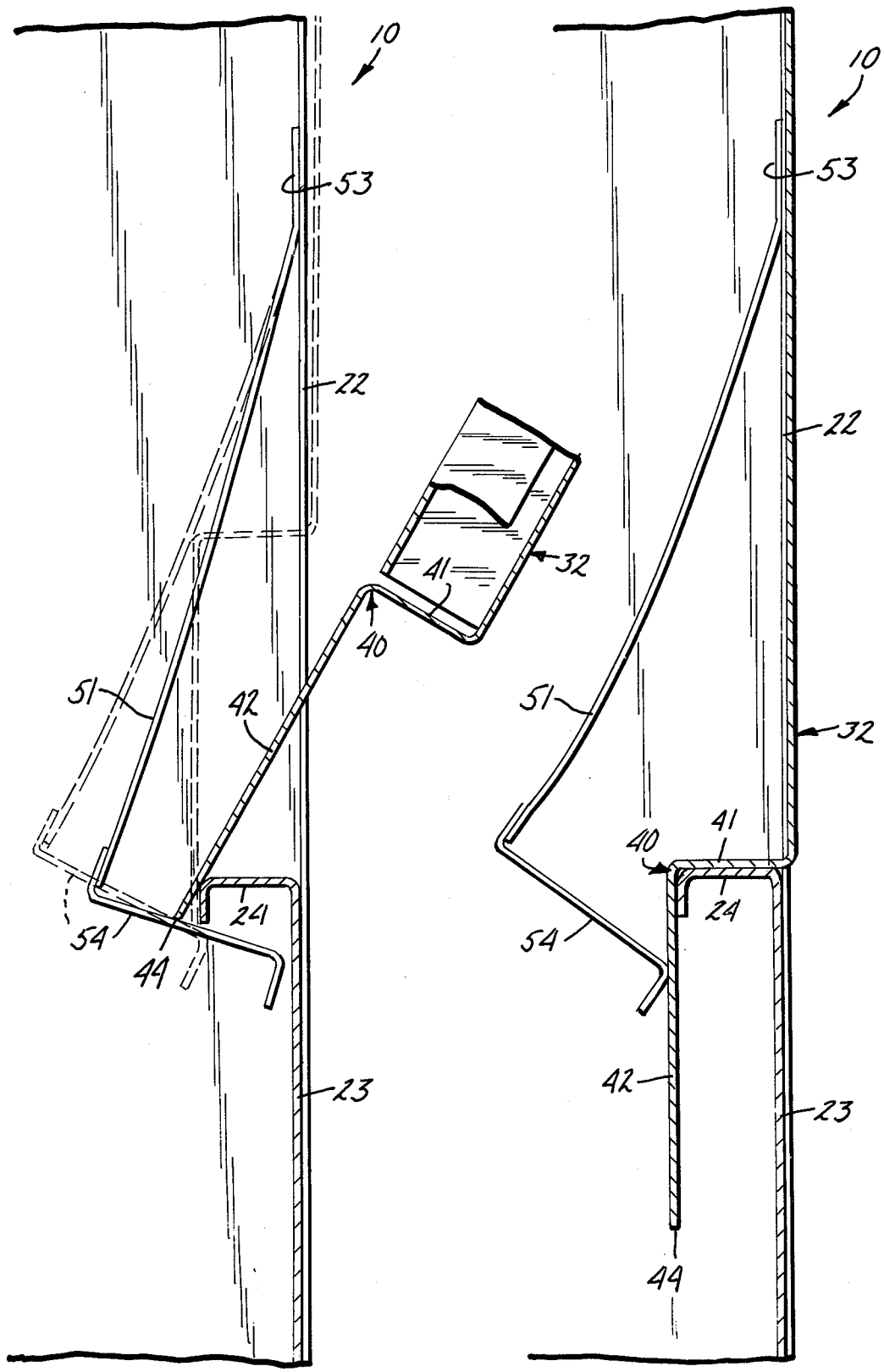
FIG. 6 is a fragmentary sectional view generally along the line 6—6 of FIG. 1, showing steps in the application of the cover to the cabinet structure.
FIG. 7 is a view like FIG. 6 but showing the cover fully installed.

Referring to the drawing, a weather resistant enclosure according to my invention comprises a cabinet structure 10 and a cover 11 therefor. Structure 10 comprises a bottom 12, a pair of sides 13, 14, and a back 15. The top 16 of the structure is open, and its front 17 has an open upper portion 20, flanked by flanges 21 and 22 extending inwardly from sides 13 and 14, and a lower portion closed by a panel 23 having an inturned upper lip 24. Bottom 12 may be solid, or may be defined by flanges 25 provided with mounting holes 26 for securing the structure to a suitable base. Back 15 may include suitable mounting means, indicated only schematically at 27, for supporting components to be protected in the structure, and may include any desired locking means as suggested at 30.

Cover 11 comprises a top portion 31, having a pyramidal configuration if desired, and a front portion 32. Portion 31 is configured, by repeated infolding through 90° as shown at 33 in FIG. 3, to resiliently engage by lips 34 the upper edge of back 15 and sides 13 and 14: it may be provided with means not shown for completing the locking function of the structure.

Front portion 32 is similarly configured, as shown at 35 in FIG. 5, to resiliently engage by lips 36, the front edges of sides 13 and 14. At the bottom of cover 11 there is a tongue 40 sized to pass between flanges 21 and 22 and comprising a first or inward step 41 and then a downward step 42. In size step 41 is slightly wider than lip 24 of panel 23, and the length of downward step 42, from step 41 to a bottom edge 44, is substantially greater than the height of lips 34.

In cooperation with tongue 40, there is provided closure assist means in structure 10 comprising a pair of resilient members 50 and 51 of spring metal secured at upper outer corners 52 and 53 to the inner surfaces of flanges 21 and 22 respectively, as by spot welding. Secured to the lower edges of members 50 and 51 are forwardly directed ledges, one of which is shown at 52 in FIGS. 6 and 7. Members 50 and 51 and ledges 54 are so dimensioned that the forward edges of the ledges 54 extend below lip 21 and are urged toward panel 23, resiliently engaging the inner surface thereof if desired.

OPERATION

FIG. 6 shows the steps in the installation of the cover on the cabinet structure, and FIG. 7 shows the cabinet with cover 11 fully installed. The first installation step is to place the cover so that the bottom edge 44 of tongue 40 rests on ledges 54, as shown in solid lines in FIG. 6. Top portion 31 is at the time substantially above the top edges of sides 13, 14 and back 15, so that lips 34 are not in engagement therewith, and since tongue 40 centers the cover between line flanges 21 and 22, it is relatively simple to pivot cover 11 backward on edge 44 of tongue 40 until lips 36 begin to engage sides 13 and 40. Presently the situation shown in broken lines in FIG. 6 is reached: the rear of step 41 engages members 50, 51 between ledges 54 and flanges 21, 22, and pushes the members backward, drawing ledges 54 across and under member 40 until the support of the cover by the ledges ceases. The cover is now allowed to move downward and to pivot slightly backward if necessary, until lips 34 complete the closure at the top, and the cabinet may now be locked.

It will be evident that when the cabinet is closed forward movement of cover 11 at its bottom is prevented by engagement of tongue 40 with the inner edge of lip 24, and that any other movement of the cover may be prevented by the locking means. The result is a weather resistant closure which can be easily operated by one man, even with the large sized cabinets used in electrical distribution system.

Numerous characteristics and advantages of my invention have been set forth in the foregoing description, together with details of the structure and function of the invention, and the novel features thereof are pointed out in the appended claims. The disclosure, however, is illustrative only, and changes may be made in detail, especially in matters of shape, size, and arrangement of parts, within the principle of the invention, to the full extent indicated by the broad general meaning of the terms in which the appended claims are expressed.

What is claimed is:

1. In a weather resistant cabinet comprising a cabinet structure and a cover, said structure including a bottom, a pair of opposite sides, a back, an open top, and a front having an open upper portion and a lower portion closed by a panel having an inturned upper lip, and said cover having a top portion, configured to resiliently engage the upper edges of said back and said sides outwardly, and a front portion, configured to resiliently engage the edges of said sides outwardly, the improvement which comprises:
    (A) a pair of flanges flanking the front edges of said sides and extended toward one another,
    (B) resilient means secured to the rear surfaces of said flanges and extending therefrom downwardly and toward each other,
    (C) forwardly directed support means carried at the bottom of said reslient means and normally urged below the lip of said panel and toward the inner surface of said panel, and
    (D) a tongue extending from the bottom of said front portion of said cover and stepped inwardly and then downwardly to fit over and behind said lip and between said flanges.

2. A structure according to claim 1 in which said resilient means comprises a pair of resilient members secured at upper corners to the rear surfaces of said flanges, and said support means comprises ledges carried at the bottoms of said resilient members for holding the lower ends of said resilient members backwardly displaced from said lip.

3. In a weather resistant cabinet, in combination:
    (1) a cabinet structure including a bottom, a pair of opposite sides, a back, an open top, and a front having an open upper portion, flanked by flanges extending inwardly from the sides, and a lower portion, closed by a panel having an inturned upper lip; and
    (2) closure assist means comprising resilient members secured to the rear surfaces of said flanges and extending downwardly and toward one another, and forwardly directed ledges carried at the bottoms of said members to extend forward toward the rear surface of said panel below said lip.

4. A weather resistant cabinet comprising, in combination:
    (1) a cabinet structure including a bottom, a pair of opposite sides, a back, an open top, and a front having an open upper portion, flanked by flanges extending inwardly from said sides, and a lower portion, closed by a panel having an inturned upper lip;
    (2) a cover having a top portion cofigured for resiliently engaging the upper edges of said back and said sides outwardly, and a front portion configured for resiliently engaging the front edges of said sides outwardly above said panel, and having at its bottom a tongue stepped inwardly and then downwardly to fit over and behind said lip and between said flanges, so that when said cover is fully closed, the inward step rests on said lip; and
    (3) closure assist means comprising resilient members secured to the rear surfaces of said flanges and extending therefrom downwardly and toward one another, and forwardly directed ledges carried at the bottoms of said members to extend forward to the rear surface of said panel below said lip, so that when said cover is to be placed on said structure, said tongue may first be inserted between said flanges to rest and pivot on said ledges behind said lip, and thereafter as said cover is pivoted into closed position the inward step of said tongue engages said resilient members to displace said ledges rearwardly from beneath said tongue, whereby to enable the cover to settle into full resilient engagement with said structure.

* * * * *